US006338631B1

(12) United States Patent
Hashimoto et al.

(10) Patent No.: US 6,338,631 B1
(45) Date of Patent: Jan. 15, 2002

(54) ELECTRICAL COUPLER FOR DETACHABLE INTERCONNECTION BETWEEN A MAIN UNIT AND AN EXTERNAL UNIT

(75) Inventors: Shunsuke Hashimoto, Tsu; Kenji Okura, Hisai, both of (JP)

(73) Assignee: Matsushita Electric Works, Ltd., Osaka (JP)

(*) Notice: Subject to any disclaimer, the term of this patent is extended or adjusted under 35 U.S.C. 154(b) by 0 days.

(21) Appl. No.: 09/272,101

(22) Filed: Mar. 19, 1999

(30) Foreign Application Priority Data

Mar. 26, 1998 (JP) .......................................... 10-079385

(51) Int. Cl.$^{7}$ .......................... H01R 12/00; H05K 1/00

(52) U.S. Cl. .......................... 439/79; 439/362; 439/80; 439/67

(58) Field of Search ............................ 439/362, 79, 86, 439/67

(56) References Cited

U.S. PATENT DOCUMENTS

| | | | | |
|---|---|---|---|---|
| 3,864,000 A | * 2/1975 | Coller et al. | 339/64 M |
| 4,050,769 A | * 9/1977 | Ammon | 339/196 M |
| 4,054,345 A | * 10/1977 | Sherwood | 339/17 M |
| 4,810,215 A | 3/1989 | Kaneko | |
| 5,116,239 A | * 5/1992 | Siwinski | 439/497 |
| 5,252,080 A | * 10/1993 | Pesson | 439/79 |
| 5,415,569 A | * 5/1995 | Colleran et al. | 439/620 |
| 5,575,690 A | 11/1996 | Eaton | |
| 5,647,749 A | 7/1997 | Atoh et al. | |
| 5,688,130 A | 11/1997 | Huang | |
| 5,816,861 A | 10/1998 | Cheng | |
| 6,039,583 A | * 3/2000 | Korsunsky et al. | 439/101 |
| 6,068,494 A | * 5/2000 | Tokuwa | 439/79 |
| 6,227,875 B1 | * 5/2001 | Wu et al. | 439/79 |

FOREIGN PATENT DOCUMENTS

| | | |
|---|---|---|
| CN | 1175720 | 3/1988 |

* cited by examiner

*Primary Examiner*—Lincoln Donovan
*Assistant Examiner*—Kyung S. Lee
(74) *Attorney, Agent, or Firm*—Rader, Fishman & Grauer, PLLC

(57) ABSTRACT

An electrical coupler which is capable of being easily assembled into a main unit for electrically detachable interconnection of an external unit to the main unit. The coupler includes a dielectric header which carries an array of first terminal ends and an array of second terminal ends which are engageable with an arrays of first contacts of the main unit and an array of second contacts of the external unit for establishing an electrical interconnection. The header is made of a rigid material which integrally supports the array of the second terminal ends to define thereat a terminal connector responsible for detachable connection to the external unit. The header is molded to have a mount flange as an integral part for securely fixing the header to an enclosure of the main unit. A height adjusting mechanism is provided to vary a vertical position of the header relative to a main circuit board with which the first terminal ends are connected internally of the main unit, adjusting a height of the terminal connector from the main circuit board. Thus, the electrical coupler can be successfully assembled into the main unit with the terminal connector located at a suitable position for connection with the external unit, yet assuring to easily fix the terminal connector at that position to the enclosure in such a manner as to well bear the pulling and pushing force exerted at the time of connecting and disconnecting the external unit to and from the terminal connector.

6 Claims, 9 Drawing Sheets

ELECTRICAL COUPLER FOR DETACHABLE INTERCONNECTION BETWEEN A MAIN UNIT AND AN EXTERNAL UNIT

BACKGROUND OF THE INVENTION

1. Field of the Invention

The present invention is directed to an electrical coupler for detachable interconnection between two electrical units, one being a main unit and the other being an external unit which is additional and detachable to the main unit.

2. Description of the Prior Art

In the field of computer devices, particularly hand-held computers, the computers are usually accompanied with an optional device such as a CD-ROM unit or the like external unit which is to be coupled and decoupled to and from to a main unit of the computer, as required by an user. To meet this requirement, the main unit of the computer is provided with a terminal connector for detachable connection to the external unit. The terminal connector is internally connected to a circuit board incorporated in the main unit for connection with a corresponding control circuit that the computer inherently includes. In order to deal with varying locations of the terminal connector which are determined by other design requirements for different models of the computers, and therefore to deal with varying heights between the terminal connector of varying locations and the circuit board fixed in place at the bottom of the main unit, one solution is found to adopt a flexible coupler which is known to have a pair of terminal connectors at opposite ends of a flexible tape and to interconnect two circuit boards by pressing the terminal connectors into corresponding sockets of separate electrical systems. That is, one of the terminal connectors is used for connection with the external unit while the other terminal connector is to be connected internally with the main unit. Because of that the terminal connector is subject to pulling and pushing forces exerted at the time of connecting and disconnecting the external unit to and from the terminal connector, the flexible coupler should be rigidly supported to an enclosure or the like supporting structure of the main unit. Therefore, it is necessary to use an additional mounting bracket or the like to fix the terminal connector of the flexible coupler to the enclosure of the main unit. However, this involves the use of the separate parts and therefore complicates the assembly of the terminal connector, i.e., the flexible connector into the main unit of the computer.

SUMMARY OF THE INVENTION

The present invention has been accomplished in view of the above problem to provide an electrical coupler which is capable of being easily assembled into an intended main unit for electrical detachable interconnection of an external unit to the main unit. The electrical coupler in accordance with the present invention is adapted in use for detachable interconnection of two separate electric units, one being a main unit having an enclosure which mounts therein a main circuit board with an array of first contacts and the other being an external unit having an array of second contacts. The coupler includes a dielectric carrier which carries a plurality of conductors having at opposite ends thereof an array of first terminal ends and an array of second terminal ends which are engageable with the arrays of the first and second contacts, respectively for establishing an electrical interconnection therebetween. The carrier includes a header of a rigid material which integrally supports the array of the second terminal ends to define thereat a terminal connector for detachable connection to the external unit. The important features of the present invention reside in that the header is molded to have a mount flange as an integral part thereof which is adapted in user to securely fix the header to the enclosure or the main circuit board of said main unit, and that a height adjusting mechanism is provided to vary a vertical position of the header relative to the main circuit board for adjusting a height of the terminal connector from the main circuit board. With this arrangement, the electrical coupler of the present invention can be successfully assembled into the main unit in such a manner as to locate the terminal connector at a position of varying height from the main circuit board of the main unit for connection with the external unit, yet assuring to easily fix the terminal connector at that position to the wall of the enclosure or the main circuit board so that the coupler is capable of bearing the pulling and pushing force exerted at the time of connecting and disconnecting a corresponding socket or plug of the external unit to and from the terminal connector.

In a preferred embodiment, the carrier is defined totally by the header which also integrally supports the array of the first terminal ends. Each of the conductors is made from a hard continuous material into a generally L-shaped configuration to have the first and second terminal ends defined on opposite ends of the conductor. The first terminal ends are arranged within a first plane intersecting the header and the second terminal ends are arranged within a second plane which intersects the header in an angled relation, preferably at a right angle, to the first plane. The header is formed with a recess adapted in use to receive therein a first socket mounted on the main circuit board and provided with the array of the first contacts. The recess has a bottom through which the array of the first terminal ends projects for connection with the array of the first contacts. The recess is configured in order to enable the first socket to be slidable within the recess along a depth of the recess. The first terminal ends are configured to have sufficient length for keeping the first terminal ends engaged with the first contacts over a prolonged distance within which the first socket is kept engaged with the recess. Thus, the recess is cooperative with the first terminal ends to define the height adjusting mechanism.

Preferably, the first and second terminal ends are supported on a single hard dielectric core of a generally L-shaped configuration which extends through the header to have its opposite ends projecting from first and second end faces of the header and to have the first and second terminal ends supported on the opposite ends of the core. The coupler of this configuration can be used in combination with a first socket which is adapted to be mounted on the main circuit board. The first socket has a slot which is in registration with a corresponding hole in the main circuit board, allowing the first terminal ends to extend therethrough and through the main circuit board with the first terminal ends being kept in sliding engagement with the first contacts. This slot in the first socket is cooperative with the first terminal ends of sufficient length to define the height adjusting mechanism which keeps the first terminal ends engaged with the first contacts while the header is displaced in the direction of varying the height of the terminal connector from the main circuit board.

Also disclosed in the present invention is a coupler which can be used in combination with a spacer adapted to rest on the main circuit board. The spacer has a mating structure which comes into registration with a portion of the header from which the first terminal ends extend, and has a vertical slot which allows first terminal ends to extend therethrough. The spacer is cooperative with the first terminal ends of sufficient length to define the height adjusting mechanism. The first terminal ends are arranged to give a dual-in-line terminal array which is adapted to extend through corresponding through-holes in the main circuit board for direct bonding thereto.

In a further embodiment of the present invention, the header, which integrally supports the arrays of the first and second terminal ends, are designed to have two available orientations for interconnection of the main unit and the external unit. That is, the arrays of the first and second terminal ends are of identical arrangement for selectively engageable with the arrays of the first and second contacts with the header being disposed at either of the two orientations. The first and second end faces, from which the first and second terminal ends project respectively, are configured to be capable of effecting a mating contact with a first socket provided with the array of the first contacts. The first end face is cooperative with the second plane in which the second terminal ends are arranged in the array, to define therebetween a first height. The second end face is cooperative with the first plane, in which the array of the first terminal ends are arranged, to define therebetween a second height. The first and second heights are set to be different from each other so that the height adjustment of the terminal connector can be made by selecting one of the first and second end faces for mating on the first socket, i.e., by selectively disposing the header in either of the two orientations given to the header.

In a still further embodiment of the present invention, the carrier includes, in addition to the header, an auxiliary header of a hard material integrally supporting the array of the first terminal ends, and a flexible tape extending from the header to the auxiliary header. The conductors extend from the second terminal ends through the header and the flexible tape to terminate at the first terminal ends of the additional header. In this case, the flexible tape defines the height adjusting mechanism for the terminal connector with respect to the main circuit board.

Furthermore, the carrier may be configured to have, in addition to the header, a flexible tape extending from the header and being formed at its free end with the array of the first terminal ends.

These and still other objects and advantageous features of the present invention will become more apparent from the following description of the embodiments when taken in conjunction with the attached drawings.

DETAILED DESCRIPTION OF THE EMBODIMENTS

Figure 1:
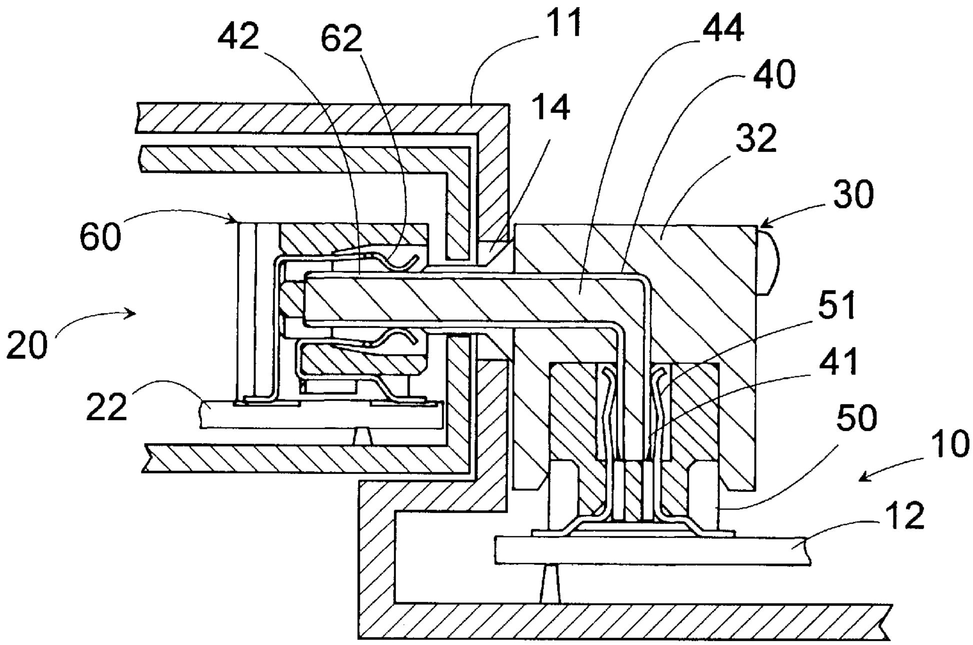
FIG. 1 is a vertical section illustrating an electric coupler as fixed to a main unit for detachable interconnection with an external unit in accordance with the a first embodiment of the present invention.

Referring now to FIGS. 1 to 6, there is shown an electrical coupler in accordance with a first embodiment of the present invention. The coupler 30 is intended for detachable electrical connection between a main unit 10 and an external unit 20, for example, between a hand-held computer main unit and a plug-in type external CD-ROM unit. In this regard, the coupler 30 includes a terminal connector 39 which is secured to an enclosure 11 or supporting structure of the main unit 10 at a suitable level for detachable connection to the external unit 20, and an array of first terminal ends 41 for internal connection with a main circuit board 12 mounted within the main unit 10. The coupler 30 has a header 32 of a dielectric hard material carrying a plurality of hard conductors 40 of a generally L-shaped configuration each defining at its opposite ends the first terminal end 41 and a second terminal end 42. The second terminal ends 42 are arranged in an array to define the terminal connector 39 for the external unit. The conductors 40 are supported on a core 44 which is made of the same dielectric material as the header into a generally L-shaped configuration to have its opposite ends projecting from the header 32 in mutually perpendicular directions. The arrays of the first and second terminal ends 41 and 42 are defined on the opposite ends of the core 44 so as to be integrally supported to the header 32 for instant connections respectively to first and second sockets 50 and 60 fixed to the main circuit board 12 of the main unit 10 and to a circuit board 22 of the external unit 20.

Figure 7:
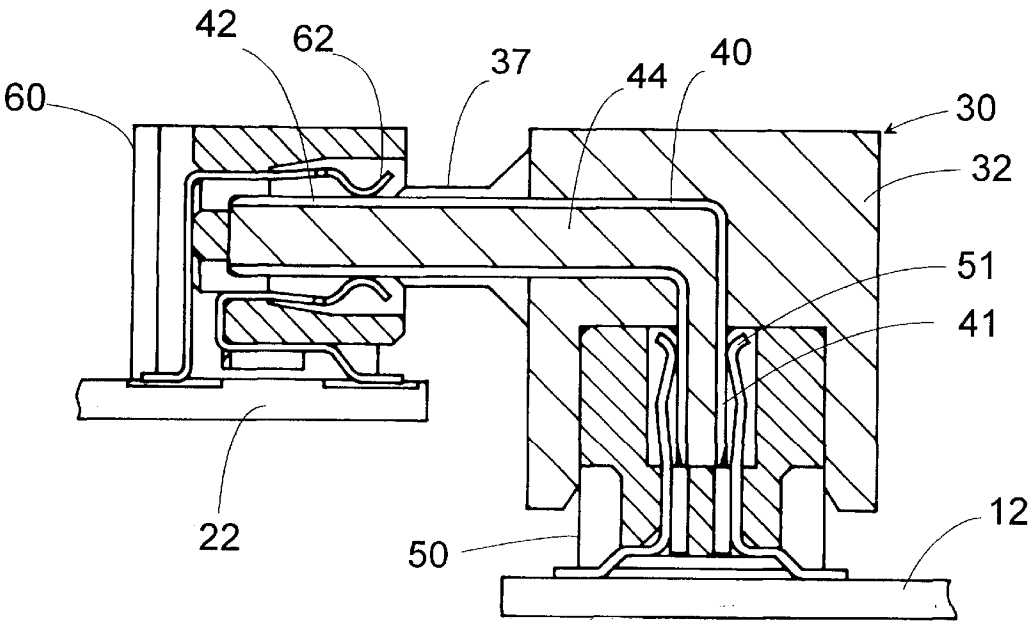
FIGS. 7 and 8 are vertical sections respectively illustrating the coupler being connected to first and second sockets at positions of varying heights from a main circuit board mounted to the main unit.
Figure 8:
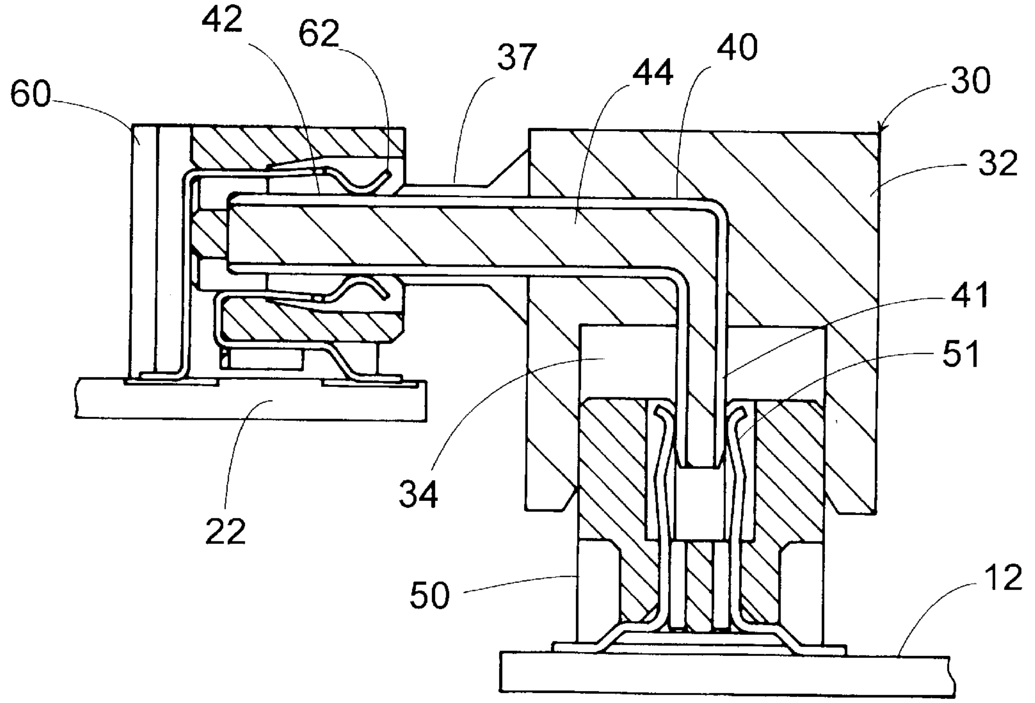
Figure 9:
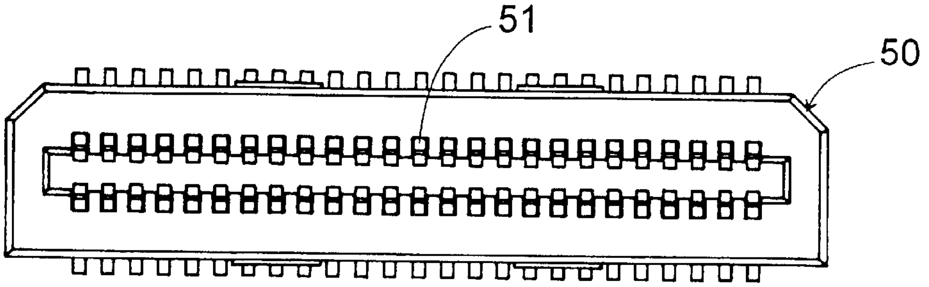
FIG. 9 is a top view of the first socket.
Figure 10:
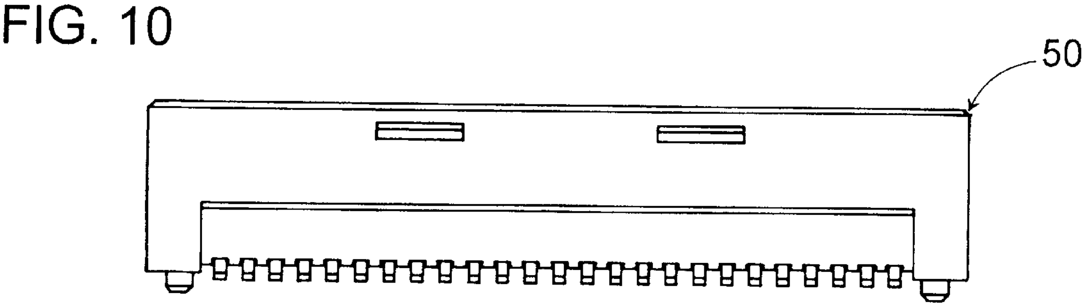
FIG. 10 is a front view of the first socket.
Figure 11:
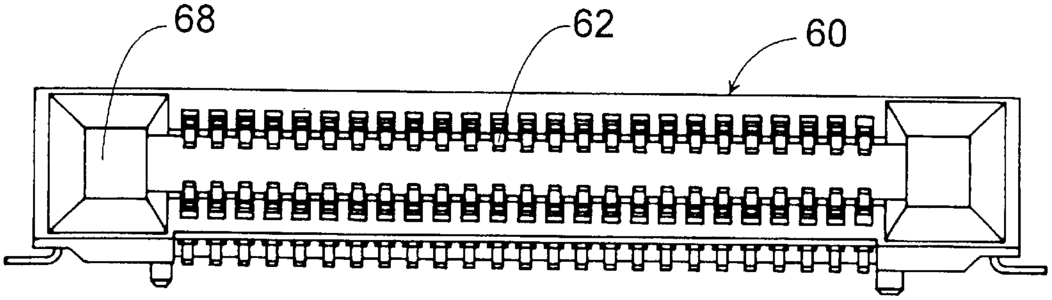
FIG. 11 is a front view of the second socket.
Figure 12:
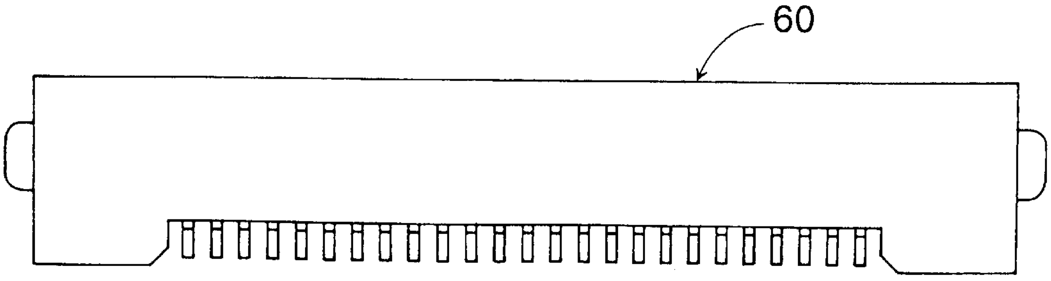
FIG. 12 is a top view of the second socket.

As shown in FIGS. 9 to 12, the first and second sockets 50 and 60 are formed to have individual slots provided with arrays of first and second contacts 51 and 62 which are engageable respectively with the first and second terminal ends 41 and 42 of the coupler. The header 32 is formed in its bottom with a recess 34 into which the first socket 50 fits slidably so as to adjust the height of the terminal connector, i.e., the array of the second terminal ends 42 relative to the main circuit board 12, as shown in FIGS. 7 and 8. The first terminal ends 41 project from the bottom of the recess 34 by a sufficient length to be kept engaged with the first contacts 51 while the first socket 50 is retained within the recess 34.

Figure 2:
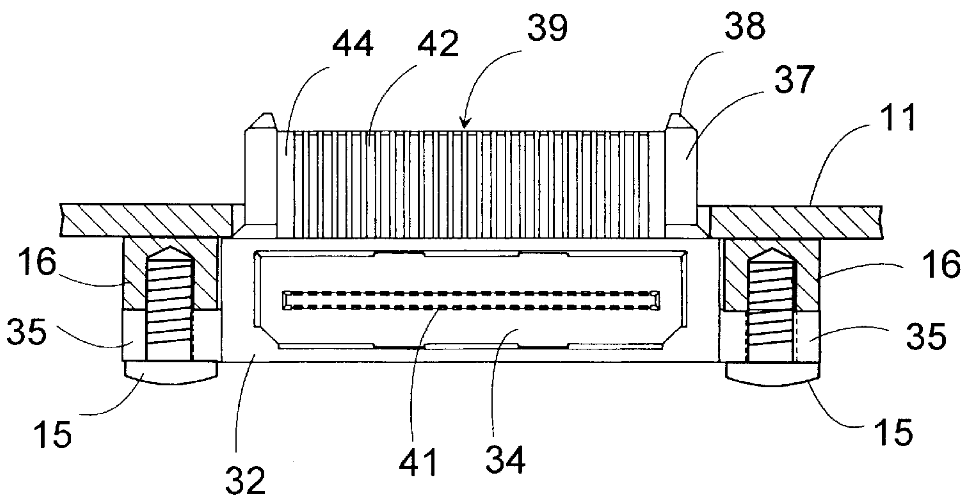
FIG. 2 is a bottom view of the coupler as fixed to the main unit.

The header 32 is molded to have a pair of mount flanges 35 as integral parts thereof for securing the header 32 or the terminal connector 39 to a wall of the enclosure 11 or the like supporting structure of the main unit 10, as shown in FIG. 2, with the array of the second terminal ends 42 projecting through an opening 14 in the wall for connection with the second socket 60. For this purpose, the mount flange 35 is formed with a hole 36 for passing therethrough a screw 15, bolt, or the like fastening element, as best shown FIGS. 2 to 4. The mount flanges 35 are held against threaded bosses 16 fixed on the interior of the enclosure 11 and is secured thereto by the screws 15.

Figure 3:
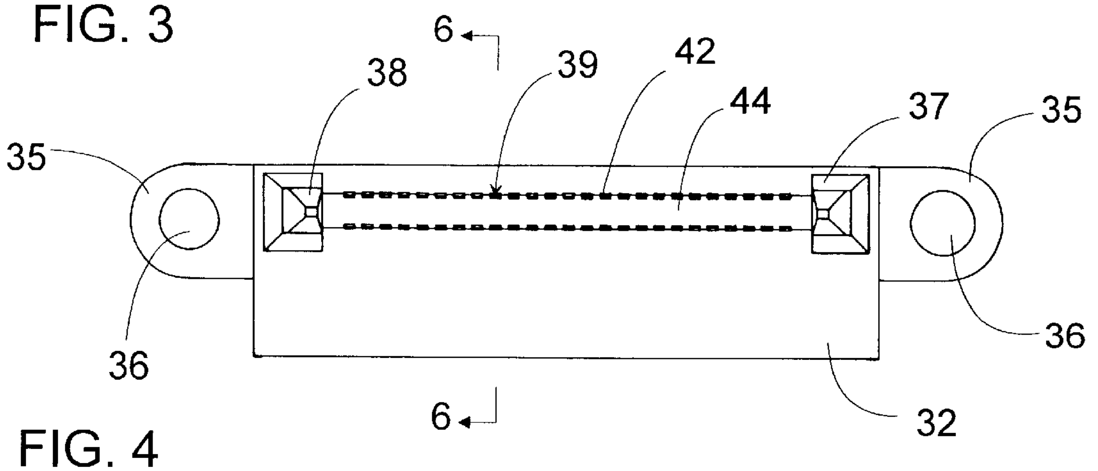
FIG. 3 is a front view of the coupler.
Figure 4:
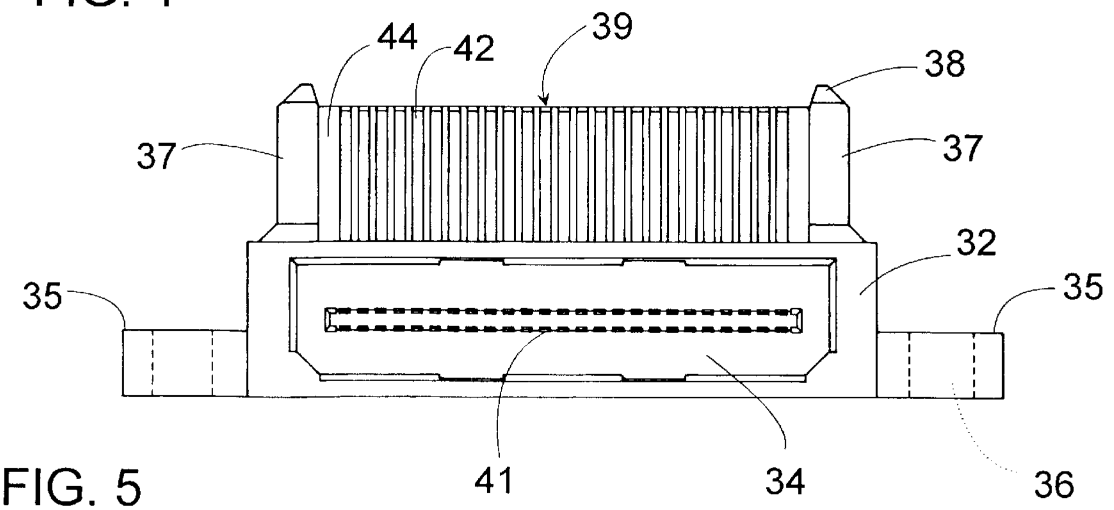
FIG. 4 is a bottom view of the electrical coupler.
Figure 5:
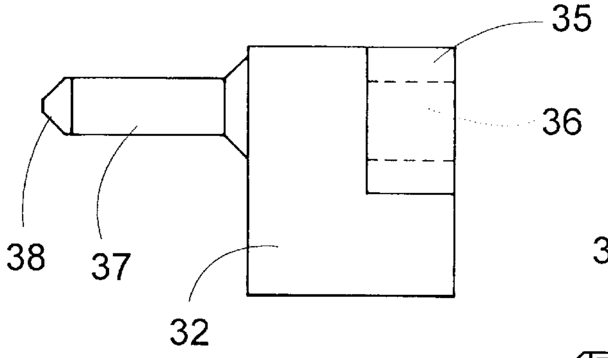
FIG. 5 is a side view of the coupler.
Figure 6:
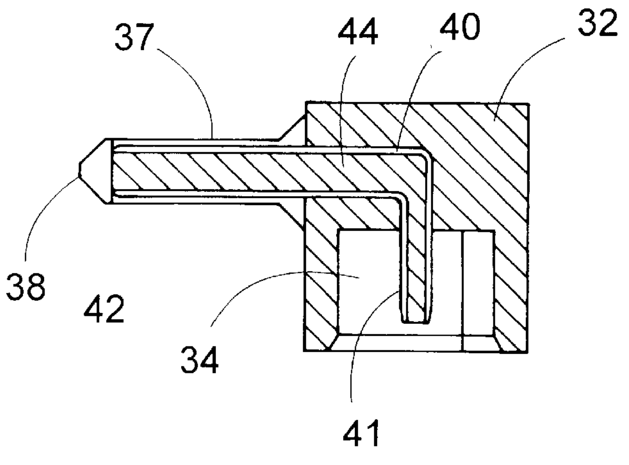
FIG. 6 is a cross section taken along line 6—6 of FIG. 3.

At the opposite ends of the array of the second terminal ends 42, there are formed with studs 37 which are integrally molded with the header 32 to extend in parallel with the second terminal ends and to have at their distal ends tapered tips 38 for registration into corresponding cavities 68 in the front end of the second socket 60. As shown in FIGS. 1, 3, and 6, the stud 37 has a thickness within which the conductors 40 on opposite faces of the core 44 are disposed. Thus, the studs 37 which extend through the opening 14 in the wall of the enclosure together with the conductors 40 provides a protection against an inadmissible contact of the second terminal ends with the enclosure wall which is normally backed-up with a metal shield.

As with the first socket 50, the second socket 60 is also configured to allow the second terminal ends 42 to be kept engaged with the second contacts 62 over a prolonged distance within which the second socket 60 is capable of moving to and from the header 32 or the terminal connector 39, thus enabling a horizontal positional adjustment of the second socket 60 relative to the terminal connector 39 fixed to the enclosure 11 of the main unit 10.

Although the illustrated embodiment discloses that the conductors 40 is bent at a right angle to enable the height adjustment of the header 32 or the terminal connector 39 relative to the main circuit board 12, the conductor may be bent at any other suitable angles to have the arrays of the first and second terminal ends arranged respectively in separate planes which crosses at that angle with each other.

Figure 13A:
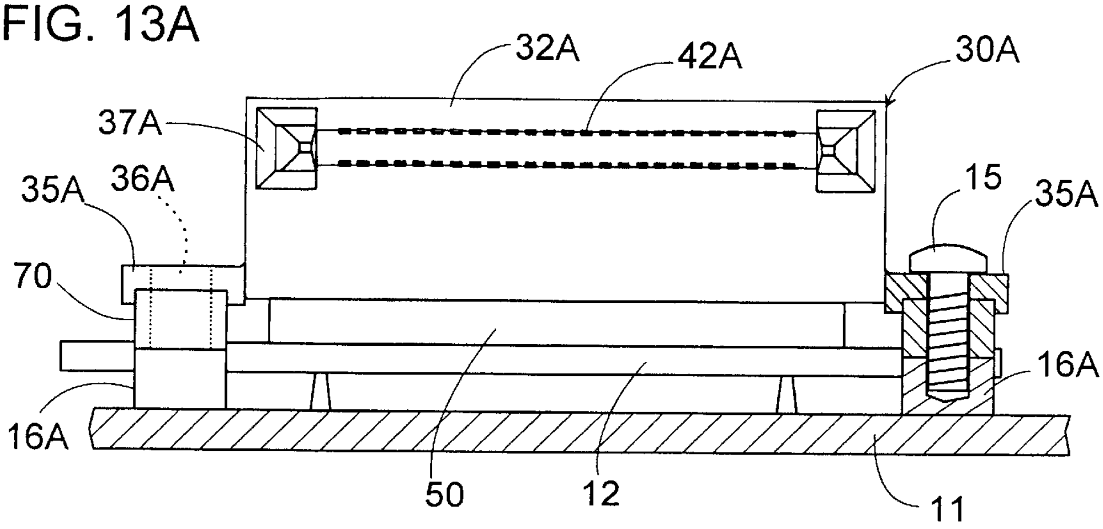
FIG. 13A is a front view of an electric coupler which is a modification of the first embodiment, shown as secured to the bottom of the enclosure.

FIG. 13A shows an electric coupler in accordance with a modification of the first embodiment in which a like header 32A is designed to be secured to a bottom wall of the enclosure 11 of the main unit 10 by use of like mount flanges 35A and optionally in combination with a spacer 70. The mount flanges 35A are molded integrally with the header 32A to extend from the lower end of the header 32A and are formed with like holes 36A for passing therethrough a screw 15, bolt, or the like fastening element. The mount flange 35A is formed in its bottom with a concavity for engagement with the spacer 70. The mount flanges 35A are placed upon threaded bosses 16A on the bottom wall of the enclosure 11 with or without the spacer 70 interposed therebetween and are secured by screws 15. The other configurations of the coupler is identical to those of the first embodiment. Like parts are designated by like numerals with a suffix letter of "A".

Figure 13B:
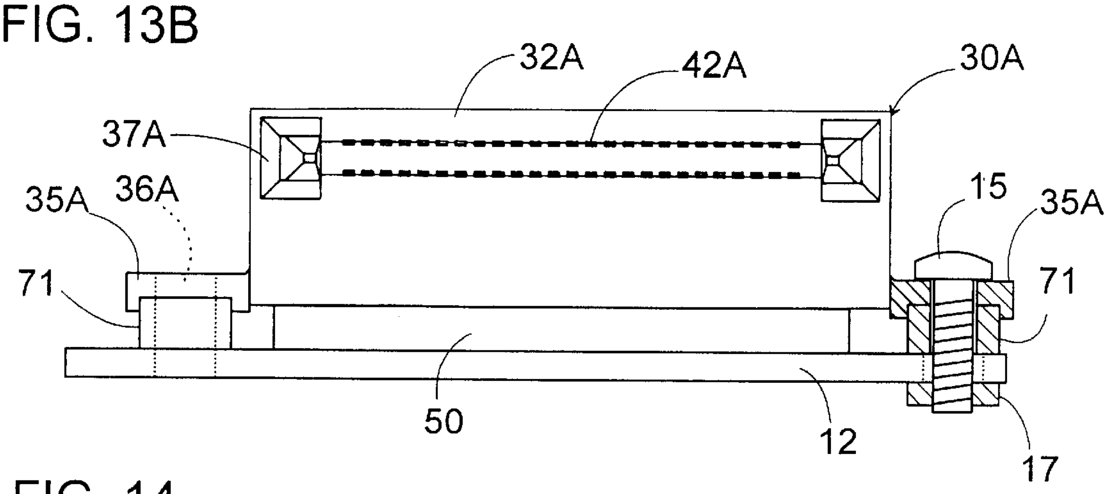
FIG. 13B is a front view of the above coupler shown as secured to the main circuit board.

As shown in FIG. 13B, the coupler of the above modification can be directly secured to the main circuit board 12 rather than being secured to the bottom of the enclosure, with or without the use of like spacer 71. Screws 15 extends through the holes 36A of the mount flanges 35A and through corresponding holes in the main circuit board 12 to fix the mount flanges 35A to the main circuit board 12 by use of nuts 17. The spacer 70 is optional and is not necessary when the first socket 50 is fully received in the bottom recess of the header 32A.

Figure 14:
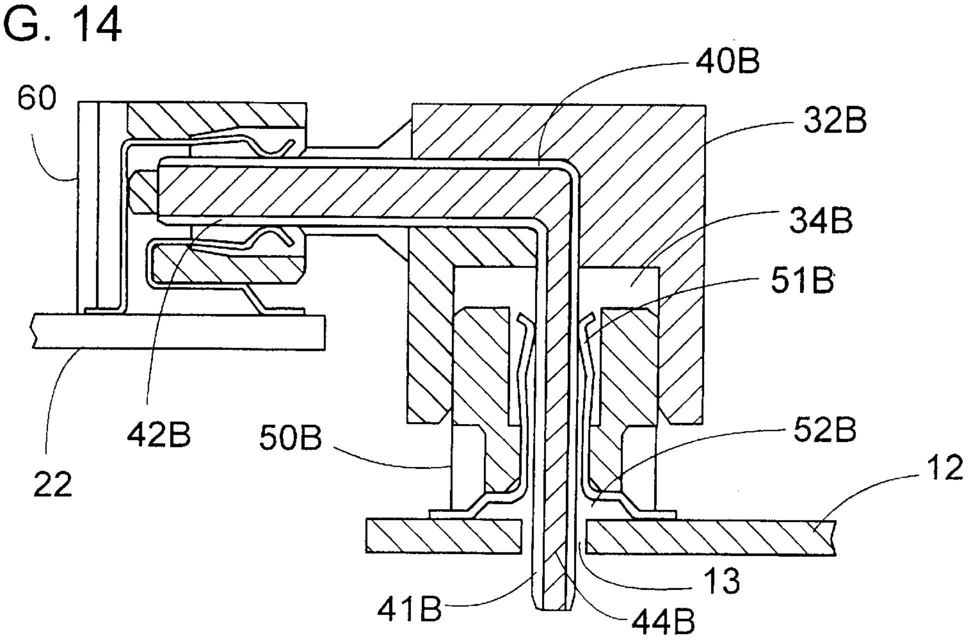
FIG. 14 is a sectional view illustrating an electric coupler in accordance with a second embodiment of the present invention.

FIG. 14 shows an electric coupler in accordance with the second embodiment of the present invention which is identical to the first embodiment except that a first socket 50B has a bottom-opened slot 52B and that the first terminal ends 41B as well as the core 44B thereof project beyond the bottom of the header 32B. Like parts are designated by like reference numerals with a suffix letter of "B". The first terminal ends 41B supported by the core 44B are allowed to pass vertically through the first socket 50B and through a corresponding hole 13 in the main circuit board 12, thus facilitating to effect the height adjustment over a greater distance than made with a combination of the header and the first socket of the first embodiment. The header 32B is molded to have integral mount flanges by which the header is secured to the wall of the enclosure of the main unit 10, in the like manner as in the first embodiment.

Figure 15:
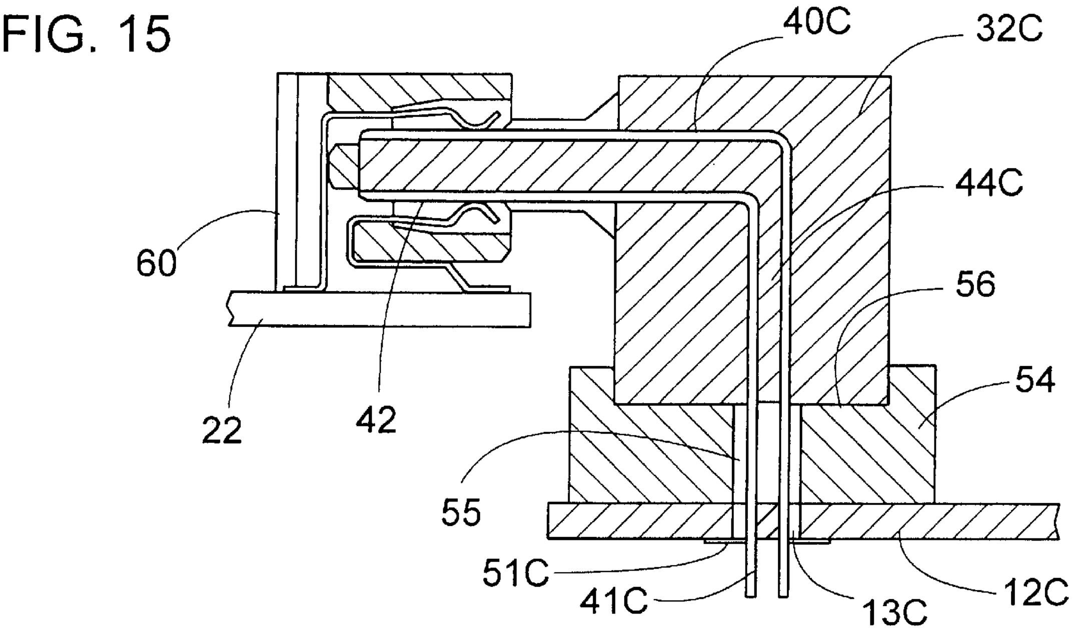
FIG. 15 is a sectional view illustrating an electric coupler in accordance with a third embodiment of the present invention.

FIG. 15 shows an electric coupler in accordance with a third embodiment of the present invention which is intended to connect the first terminal ends 41C directly to first contacts 51C arranged in an array on the bottom of the main circuit board 12C. For this purpose, the first terminal ends 41C project from the bottom of the header 32C without being supported by the core 44C. Other structures are similar to the first embodiment, therefore like parts are designated by like reference numerals with a suffix letter of "C". In order to adjust the height of the header 32C from the main circuit board 12C, a spacer 54 of suitable height is interposed between the header 32C and the circuit board 12C. The spacer 54 has a vertical slot 55 for passing therethrough the first terminal ends 41C and is formed in its upper end with a catch recess 56 which comes into registration with the bottom of the header 32C. The exposed first terminal ends 41C is guided through holes 13C in the circuit board 12C for soldering to the associated first contacts. Also in this embodiment, the header 32C has integrally molded mount flanges for securing the header 32C to the enclosure wall of the main unit.

Figure 16:
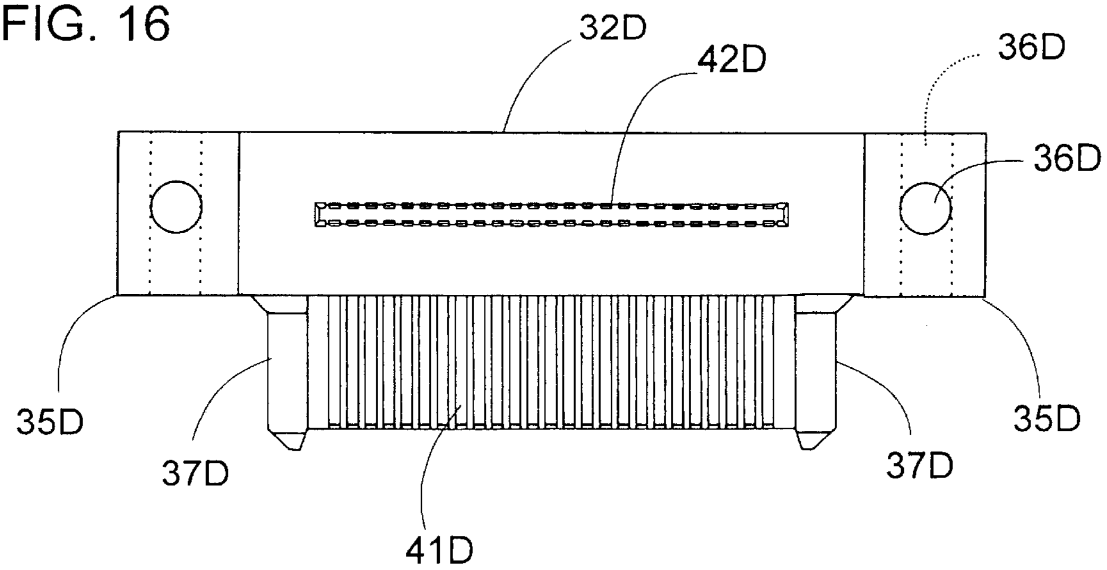
FIG. 16 is a front view of an electric coupler in accordance with a fourth embodiment of the present invention.
Figure 17:
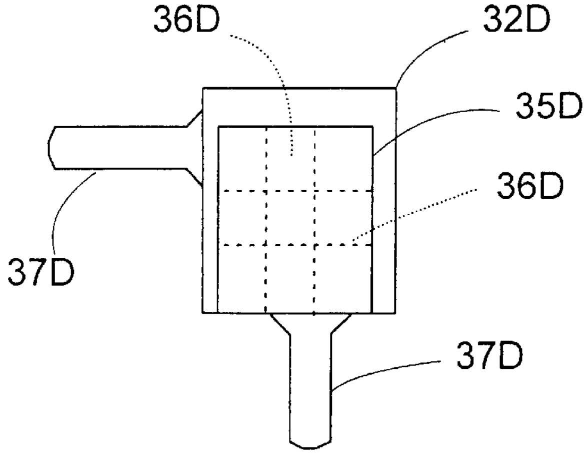
FIG. 17 is a side view of the coupler of FIG. 16.

FIGS. 16 to 18 show an electric coupler in accordance with a fourth embodiment of the present invention which is similar to the first embodiment but it is intended to give two available orientations in which the header 32D can be connected to the first socket of the main unit 10 in order to vary a height at which the coupler is connected to the second socket 60 of the external unit 20 with respect to the main circuit board 12. Like parts are designated by like numerals with a suffix letter of 'D'. The header 32D integrally supports the arrays of first and second terminal ends 41D and 42D which are of the same arrangement so as to be selectively engageable with the first second socket 50D and the second socket 60D. In this sense, any one of the arrays of the first and second terminal ends constitutes the terminal connector for detachable connection to the external unit.

Figure 18A:
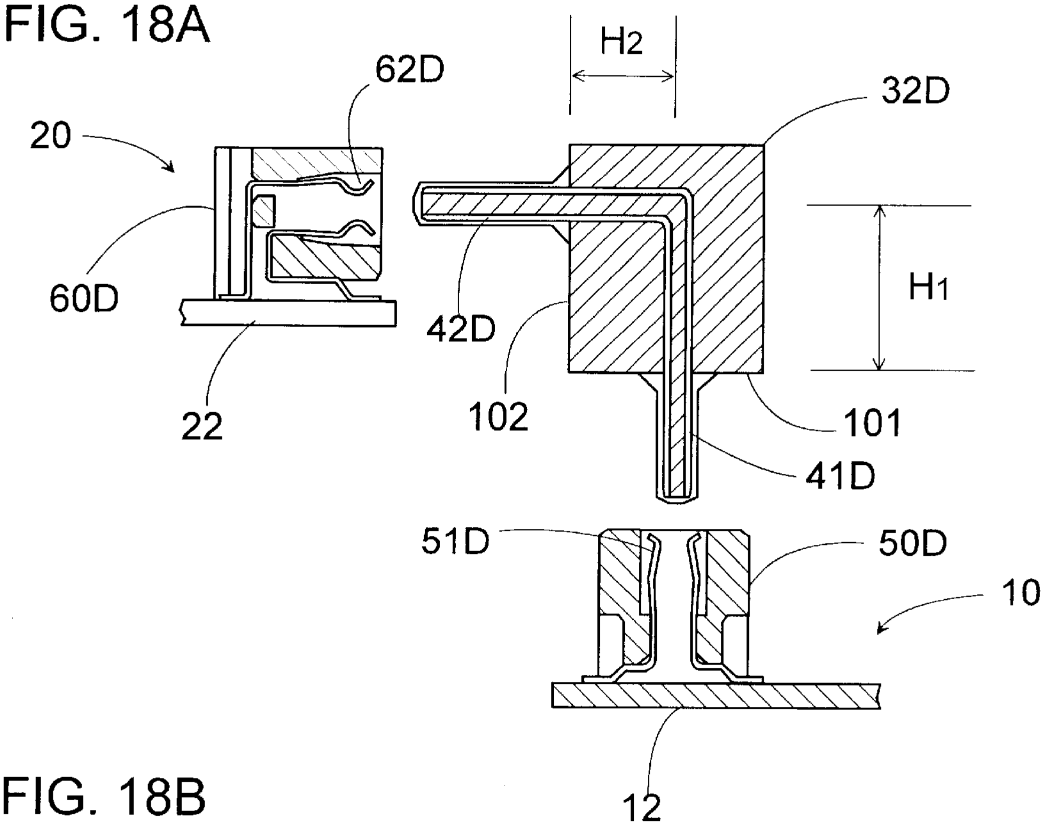
FIGS. 18A and 18B are sectional views illustrating two orientations in which the coupler is disposed at different heights with respect to a main circuit board.
Figure 18B:
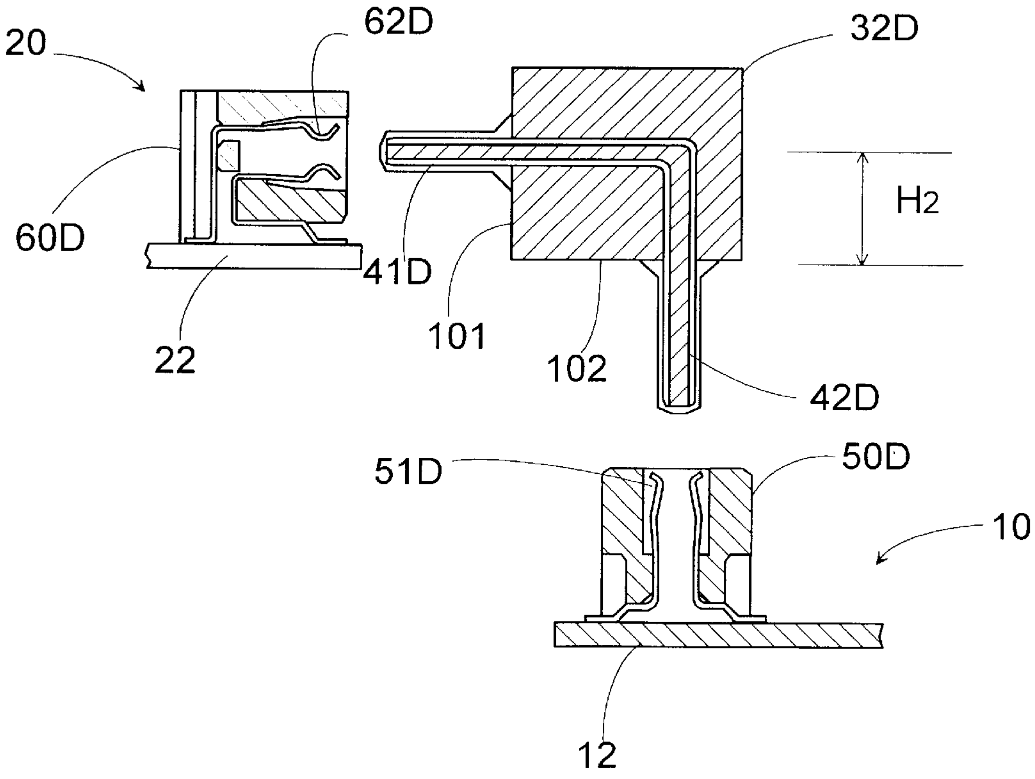

As shown in FIGS. 18A and 18B, the header 32D has a rectangular section defining first and second end faces 101 and 102 from which first and second terminal ends 41D and 42D project. The first and second end faces are shaped to come into mating engagement with the first socket 50D, when engaging either of the first and second terminal ends 41D and 42D to the first contacts 51D of the first socket 50D. The first end face 101 is spaced by a distance of H1 from the second plane within which the second terminal ends 42D are arranged, while the second end face 102, which is perpendicular to the first end face 101, is spaced by a distance of H2 from the first plane within which the first terminal ends 41D are arranged. In this embodiment, H1 is made greater than H2. Thus, by selecting one of the first and second end faces 101 and 102 for mating contact with the first socket 50D, it is possible to adjust the height of the terminal connector defined by either one of the first and second terminal ends from the main circuit board 12.

In order to fix the header 32D to the enclosure of the main unit 10 irrespective of the orientation of the coupler, i.e., whether it is oriented as shown in FIGS. 18A or 18B, the mount flanges 35D integrally formed with the header 32D are each configured to have two holes 36D extending in mutually perpendicular directions, as shown in FIGS. 16 and 17, for receiving screws or the like fastening element utilized to fix the header to the enclosure or the like supporting structure. A pair of studs 37D extend integrally from each of the first and second end faces 101 and 102 to be disposed on opposite ends of each array of the first and second terminal ends 41D and 42D, in the like fashion as in the first embodiment.

Figure 19:
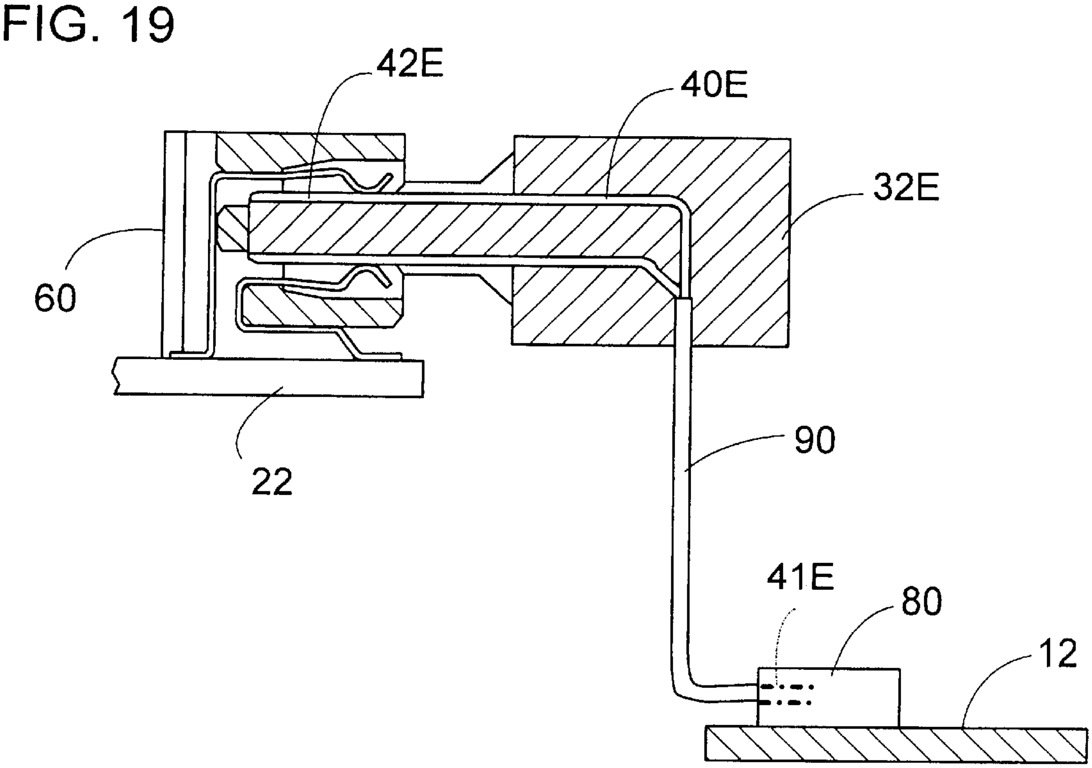
FIG. 19 is a sectional view illustrating an electric coupler in accordance with a fifth embodiment of the present invention.

FIG. 19 shows an electric coupler in accordance with a fifth embodiment of the present invention which utilizes a flexible tape 90 for height adjustment of a header 32E relative to the main circuit board 12E. The coupler includes, in addition to the header 32E integrally supporting the array of the second terminal ends 42E, a sub-header 80 integrally supporting the array of the first terminal ends 41E which are interconnected to the array of the second terminal ends by the conductors 40E carried partly on the flexible tape 90. Thus, the header 32E can be fixed to the wall of the enclosure at a designated height, while making an internal connection through the flexible tape 90 to the main circuit board 12E fixed in the enclosure. Like parts are designated by like numerals with a suffix letter of "E". The header 32E has integrally molded mount flanges for securing the header 32E to the enclosure wall of the main unit.

Figure 20:
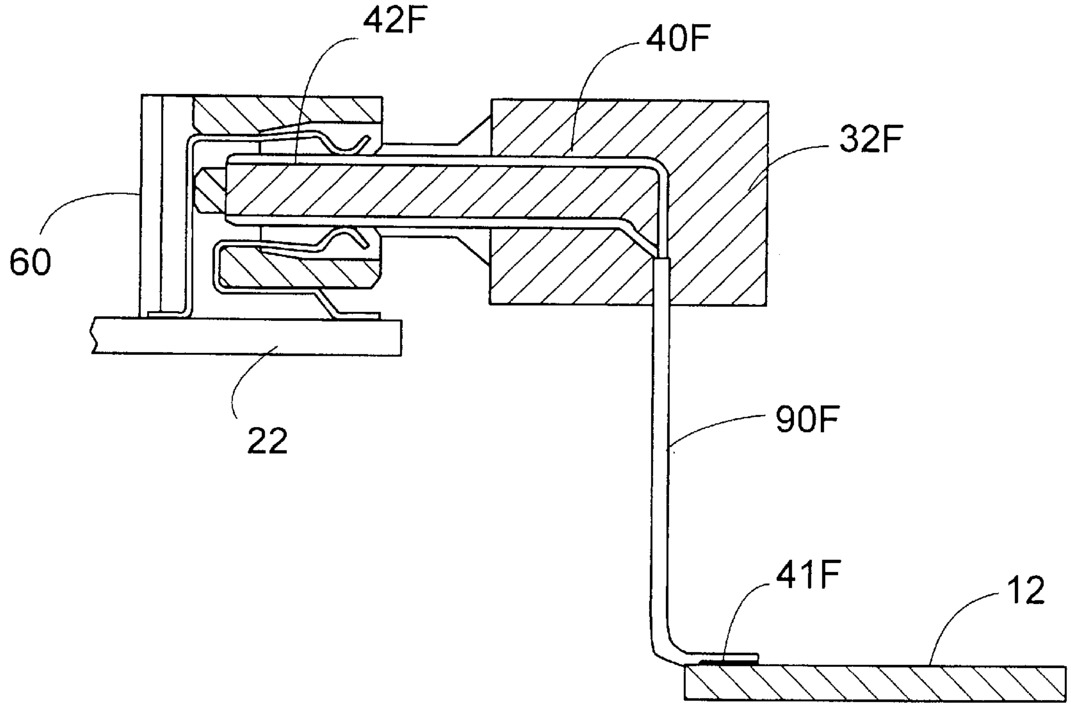
FIG. 20 is a sectional view illustrating an electric coupler in accordance with a sixth embodiment of the present invention.

FIG. 20 shows an electric coupler in accordance with a sixth embodiment of the present invention which is similar to the fifth embodiment except that the array of the first terminal ends 41F are defined on one end of the flexible tape 90F for direct bonding to an associated array of first contacts formed on the main circuit board 12F. Like parts are designated by like reference numerals with a suffix letter of "F". Also in this embodiment, the header 32F has integrally molded mount flanges for securing the header 32F to the enclosure wall of the main unit.

Figure 21:
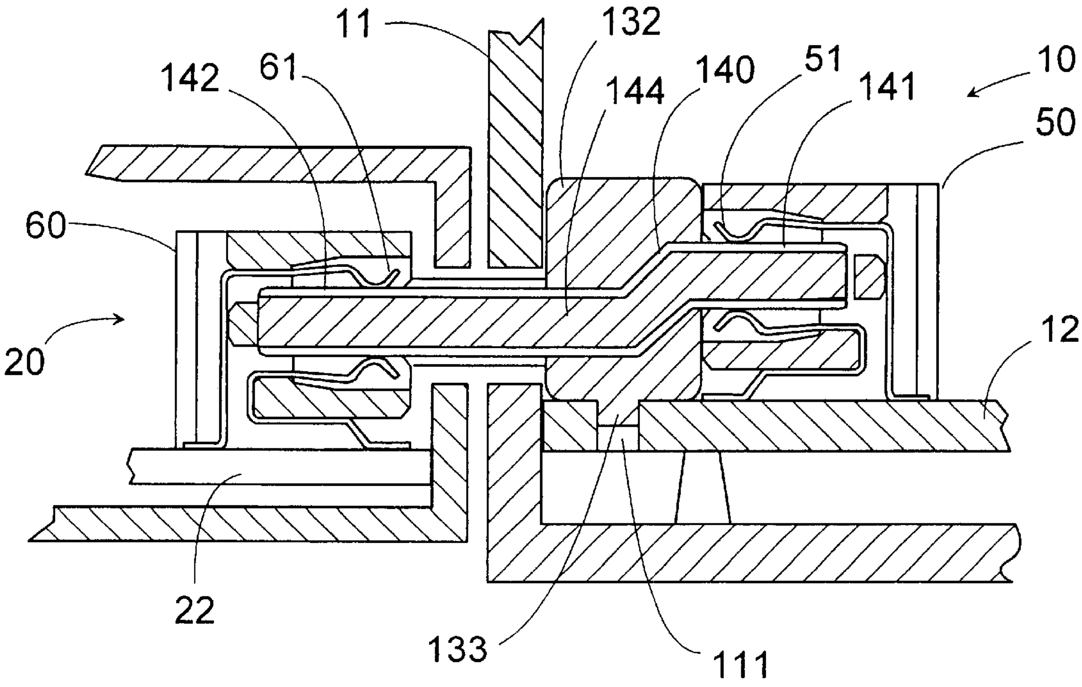
FIG. 21 is a sectional view illustrating another electric coupler for detachable connection between the main unit and the external unit.
Figure 22:
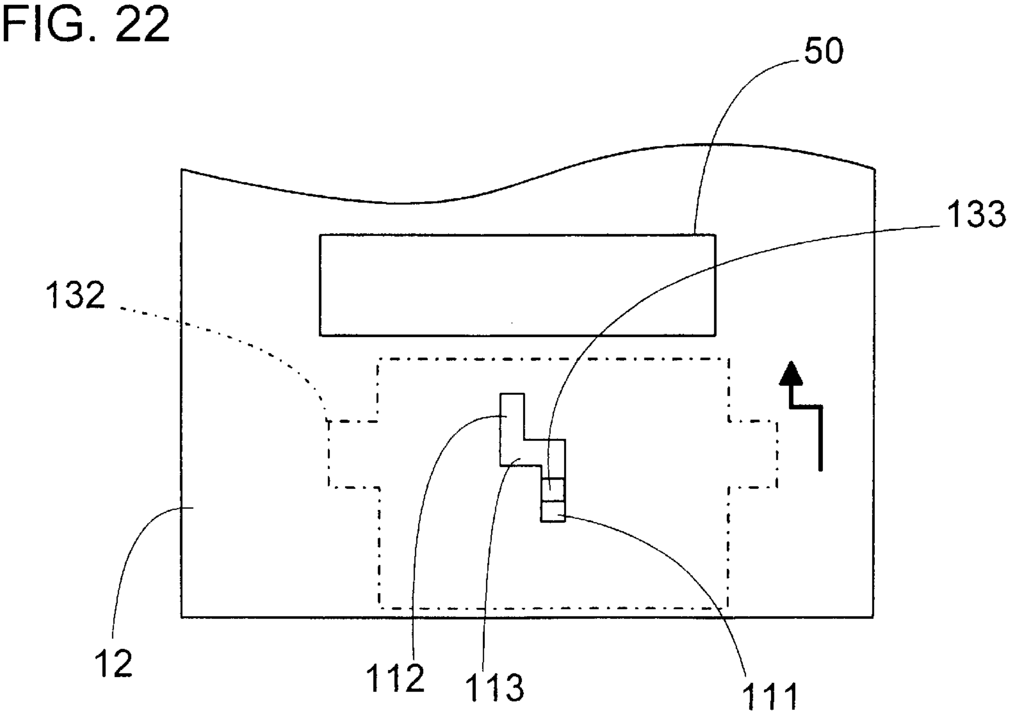
FIG. 22 is a top view schematically illustrating a main circuit board supporting the coupler of FIG. 21.

FIG. 21 shows another electric coupler for detachable interconnection between the main unit 10 and the external unit 20. The coupler includes a header 132 made of a dielectric hard material and a generally Z-shaped core 144 holding a plurality of conductors 140. The core 144 and the conductors 140 extend horizontally through the header 132 to define the array of first terminal ends 141 and the array of second terminal ends 142 respectively on the projected opposed ends of the core 144 for detachable connection to first and second sockets 50 and 60. The first and second sockets 50 and 60 are fixed respectively on a main circuit board 12 of the main unit 10 and a circuit board 22 of the external unit 20, and are provided respectively with the arrays of first and second contacts 51 and 62 in correspondence to the first and second terminal ends 141 and 142. The header 132 is formed integrally with a pair of mount flanges which are secured to the wall of the enclosure 11 of the main unit in the same manner as discussed with reference to the previous embodiments and modification. The core 144 and the conductors 140 bent in a vertical section into the Z-shaped configuration enables to interconnect the first and second sockets 50 and 60 at different height levels. Projecting on the bottom of the header 132 is a rectangular guide projection 133 which is engaged with a groove in the main circuit board 12 for positively retaining the header 132 also on this main circuit board. As shown in FIG. 22, the groove is of a generally Z-shaped configuration with a leading slot 111 and an ending slot 112 which are intercommunicated through a transition slot 113. The leading slot 111 is provided to introduce the guide projection 133 for engaging the header 132 on the board prior to connecting the first terminal ends 141 to the first socket 50. Then, the header 132 is shifted laterally with the guide projection 133 following through the transition slot 113 to the ending slot 112 for registering the first terminal ends 141 with the first contacts 51 of the first socket 50. Finally, the header 132 is pushed towards the first socket 50 with the guide projection 133 proceeding through the ending slot 112 for engaging the first terminal ends 141 with the first contacts 51. Thus, the header can be easily guided on the main circuit board 12, as indicated by an arrow in FIG. 22, to be successfully connected to the fist socket 50. After being connected to the first socket 50, the header 132 is secured to the wall of the enclosure of the main unit by means of mount flanges integrally formed on opposite side faces of the header 132, in the like manner as in the first embodiment.

What is claimed is:

1. An electrical coupler adapted in use for detachable electrical interconnection of two separate electric units (10, 20), one being a main unit (10) having an enclosure (11) which mounts therein a main circuit board (12) with an array of first contacts (51) and the other being an external unit (20) having an array of second contacts (62), said coupler comprising:

a dielectric carrier (32) which carries an array of first terminal ends (41) and an array of second terminal ends (42) which are interconnected to one another by means of individual conductors (40) and are engageable with the arrays of said first and second contacts, respectively for establishing an electrical interconnection between the array of said fist and second contacts:

where said carrier (30) is molded to have a mount flange (35) as an integral part thereof which is adapted in use to securely fix said carrier (30) to a wall of said enclosure (11), said carrier (30) having a first face and a second face which are disposed at a right angle from each other, said first face being defined at a bottom of a recess (34) provided in said carrier for receiving a first socket (50) having the array of said first contacts (41), said conductors (40) being supported on opposite surfaces of an L-shaped hard dielectric core (44) and extending along the entire length of said dielectric core (44) and extending along the entire length of said dielectric core (44) to define the arrays of said first terminal ends on opposite surfaces of said core at one longitudinal ends thereof and the arrays of said second terminal ends on opposite surfaces of said core at the other longitudinal end thereof;

the arrays of said first terminal ends being cooperative with the corresponding end of said core to define a first edge connector for slidable insertion into said first socket (50) provided on said main circuit board, the arrays of said second terminal ends being cooperative with the corresponding end of said core to define a second edge connector for insertion into an associated second socket (60) provided on the side of said external unit (20) and having the array of said second contacts, said core (44) and the conductors (40) being partly embedded in said carrier (30) in such a manner as to project said first edge connector from said first face into said recess and to project said second edge connector from said second face;

said recess being configured to enable said first socket to slide within said recess along a depth of said recess for height adjustment of a vertical position of said carrier relative to said main circuit board.

2. The electrical coupler as defined in claim 1, wherein said first socket (50B) has a slot (52B) which is in registration with a corresponding hole in said main circuit board (12) so as to allow said first terminal ends (41B) to extend therethrough and through said main circuit board (12) with said first terminal ends kept in sliding engagement with said first contacts (51B).

3. The electrical coupler as defined in claim 1, wherein said carder (30) is formed with a pair of studs (37) each of which is made of electrically insulating material integrally projecting from said second face beyond distal ends of said second terminal ends, and has a tapered end (38), said second socket (50) being formed with a pair of cavities (68) for receiving the tips (38) of said studs.

4. The electrical coupler as set forth in claim 3, wherein said studs (37) are disposed on opposite ends of the array of said second terminal ends (42) with respect to a length of said array, said studs (37) having a vertical thickness in a vertical direction perpendicular to the length of said array as well as to a direction in which said second terminal ends project from said carrier, said second terminal ends (42) being located within said vertical thickness.

5. An electrical coupler adapted in use for detachable electrical interconnection of two separate electric units (10, 20), one being a main unit (10) having an enclosure (11) which mounts therein a main circuit board (12) with an array of first contacts (51) and the other being an external unit (20) having an array of second contacts (62), said coupler comprising:

a dielectric carrier (32) which carries an array of first terminal ends (41) and an a array of second terminal ends (42) which are interconnected to one another by means of individual conductors (40) and are engageable with the arrays of said first and second contacts, respectively for establishing an electrical interconnection between the array of said first and second contacts;

wherein said carrier (30) having a first face and a second face which are angled from each other at an right angle, said conductors (40) being supported on opposite surfaces of an L-shaped a hard dielectric core (44) and extending along the entire length of said dielectric core (44) to define the arrays of said first terminal ends on opposite surfaces of said core at one longitudinal ends thereof and the arrays of said second terminal ends on opposite surfaces of said core at the other longitudinal end thereof;

the arrays of said first terminal ends being cooperative with the corresponding end of said core to define a first edge connector for slidable insertion into an associated first socket (50) provided on said main circuit board and having the array of said first contacts, the arrays of said second terminal ends being cooperative with the corresponding end of said core to define a second edge connector for insertion into an associated second socket (60) provided on the side of said external unit (20) and having the array of said second contacts, said core (44) and the conductors (40) being partly embedded in said carrier (30) in such a manner as to project said first edge connector from said first face and to project said second edge connector from said second face;

the arrays of the first and second terminal ends (41D, 42D) project respectively first and second end faces (101, 102) of said carrier (30) in mutually perpendicular directions and have the identical arrangement for selectively engageable with the arrays of said first and second contacts (51D, 62D), said first and second end faces (101, 102) being adapted to be in mating contact with said first socket (50D), said first end face (101) being cooperative with said second plane to be define therebetween a first height (H1), and said second end face (102) being cooperative with said first plane to define therebetween a second height (H2), and said carrier 30 being configured to differentiate said first height from said second height.

6. The electrical coupler as defined in claim 5, wherein said carrier (30) is formed with a pair of studs (37) of electrically insulating material integrally projecting from each one of said first and second faces beyond distal ends of said first and second terminal ends, said stud having a tapered end (38), said studs (37) being disposed on opposite ends of the array of said first and second terminal ends (42) with respect to a length of said arrays, respectively, said studs (37) having a vertical thickness in a vertical direction perpendicular to the length of said arrays as well as to a projecting direction of each said first and second terminal ends, and the arrays of said first and second terminal ends (42) being located within said vertical thickness of said studs, respectively.

* * * * *